(12) United States Patent
Su

(10) Patent No.: US 6,787,919 B2
(45) Date of Patent: Sep. 7, 2004

(54) FLIP-CHIP OPTO-ELECTRONIC CIRCUIT

(75) Inventor: Jun Su, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/033,590

(22) Filed: Dec. 27, 2001

(65) Prior Publication Data

US 2003/0122263 A1 Jul. 3, 2003

(51) Int. Cl.$^7$ .............................................. H01L 23/48
(52) U.S. Cl. ........................... 257/778; 385/16; 385/24; 385/39; 528/42
(58) Field of Search ............................... 385/16, 24, 39, 385/52; 528/42; 257/680, 682, 693, 698, 704

(56) References Cited

U.S. PATENT DOCUMENTS

| | | | |
|---|---|---|---|
| 5,416,872 A | | 5/1995 | Sizer, II et al. |
| 5,940,548 A | * | 8/1999 | Yamada et al. ............... 385/14 |
| 6,084,050 A | * | 7/2000 | Ooba et al. .................. 528/42 |
| 6,236,774 B1 | * | 5/2001 | Lackritz et al. ............... 385/14 |
| 6,384,473 B1 | * | 5/2002 | Peterson et al. ............ 257/680 |
| 6,463,186 B1 | * | 10/2002 | Li ................................. 385/6 |
| 6,546,173 B2 | * | 4/2003 | Case et al. .................... 385/52 |
| 6,656,528 B2 | * | 12/2003 | Ouellet et al. .............. 427/307 |
| 6,658,174 B2 | * | 12/2003 | Doerr .......................... 385/16 |

FOREIGN PATENT DOCUMENTS

| | | |
|---|---|---|
| DE | 196 43 911 A1 | 5/1998 |
| EP | 1 094 355 A1 | 4/2001 |
| JP | 05264831 | 10/1993 |

OTHER PUBLICATIONS

T. Hayashi & k. Katsura, "New Hybrid Integrated Laser Diode–Drivers Using Microsolder Bump Bonding: SPICE Simulation of High–Speed Moduation Characteristics," IEEE, Nov. 1, 1994, vol. 12, No. 11, XP: 000485314, pp. 1963–1970, New York, USA.

* cited by examiner

Primary Examiner—David Nelms
Assistant Examiner—Mai-Huong Tran
(74) Attorney, Agent, or Firm—Kevin A. Reif

(57) ABSTRACT

A thermo-optic switch comprises two planar waveguide and a heating element couple to at least one of the planar waveguides. The heating element is coupled to a package substrate using solder bumps.

10 Claims, 2 Drawing Sheets

FLIP-CHIP OPTO-ELECTRONIC CIRCUIT

BACKGROUND OF THE INVENTION

1. Field of the Invention

The described invention relates to the field of opto-electronic circuits. In particular, the invention relates to an opto-electronic circuit that is coupled to a package substrate via solder bump technology.

2. Description of Related Art

Optical circuits include, but are not limited to, light sources, detectors and/or waveguides that provide such functions as multiplexing, demultiplexing and/or switching. Planar lightwave circuits (PLCS) are optical circuits that are manufactured and operate in the plane of the circuit. PLC technology is advantageous because it can be used to form small-scale components, such as array waveguide grating (AWG) filters, optical add/drop (de)multiplexers, optical switches, monolithic, as well as hybrid opto-electronic integration devices. Such devices formed with optical fibers would typically be much larger. Further, PLC structures may be batch fabricated on a silicon wafer.

An opto-electronic device circuit combines both electrical and optical functions. One type of opto-electronic circuit is a thermo-optic switch (TOS) made of a Mach-Zehnder interferometer. In a TOS, an optical signal is switched by providing an electrical input, i.e., an electrical current, to heat a heating element adjacent to an optical waveguide made of material, such as silica-on-silicon, that is sensitive to temperature. Heating the temperature-sensitive optical waveguide changes the refractive index and controls the path length of the optical waveguide, which results in the optical signal switching its optical path in the TOS, as is well-known. Various types of thermo-optic switches have been commercialized, such as 1×1, 1×2, 2×2, 4×4, 8×5 and 8-arrayed 2×2 varieties.

An opto-electronic device, such as a thermo-optic switch is typically coupled to an external electrical power supply by wire bonding from the power supply to the heating element of the thermo-optic switch.

DETAILED DESCRIPTION

An opto-electronic circuit is coupled to a package substrate through solder bumps. The solder bumps provide electrical connections to the opto-electronic circuit. In one embodiment, solder bumps are coupled to heating elements of a thermo-optic switch (TOS).

Figure 1:
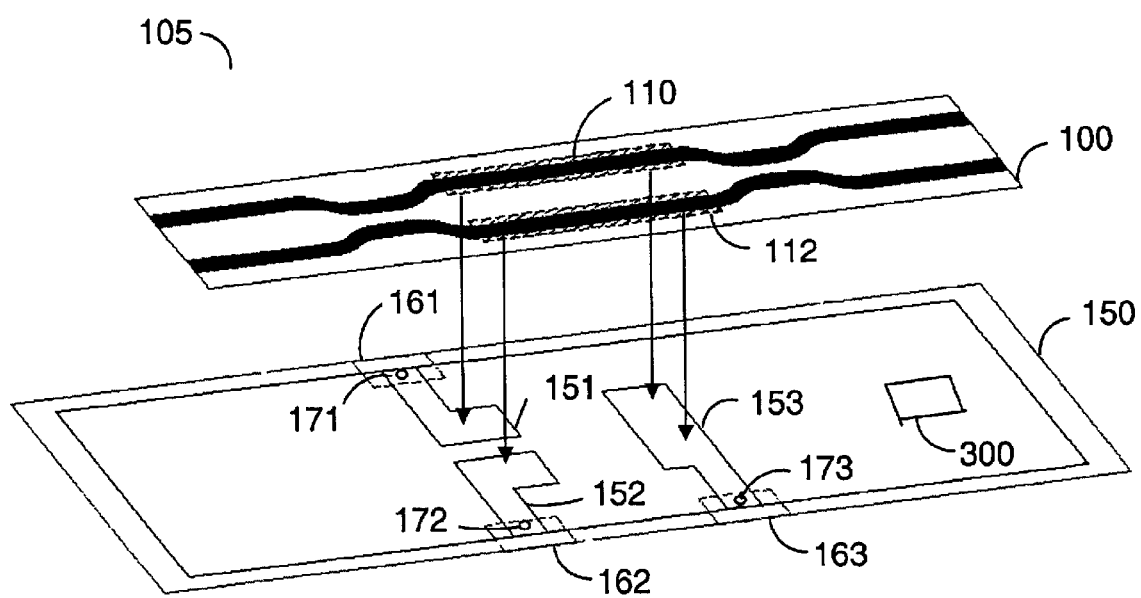
FIG. 1 is a schematic diagram showing one embodiment of an opto-electronic circuit.

FIG. 1 is a schematic diagram showing one embodiment of an opto-electronic circuit. In this embodiment, a TOS 105 is fabricated on a first substrate 100. A first heating element 110 is coupled to one portion of the TOS 105, and a second heating element 112 is coupled to a second portion of the TOS 105. In one embodiment the heating elements 110, 112 are applied in a process step that leaves the heating elements 110, 112 at least partially exposed on a top surface of the first substrate 100. The substrate 100 is subsequently turned upside down for coupling to the package substrate 150.

The package substrate 150 comprises multiple conductive strips, such as conductive strips 151, 152, and 153. The conductive strips 151, 152, and 153 are designed to make electrical contact with the exposed conductive surfaces of the TOS 105, such as the heating elements 110, 112. In one embodiment the TOS 105 is coupled to the package substrate 150 at the conductive strips 151, 152, and 153 via solder bump technology.

Solder bump technology, also called flip-chip or control collapse chip connection ("C4") technology, uses solder bumps to both attach and establish electrical connections to a package substrate 150. With this technology, solder bumps are reflowed to make connection to terminal pads on the package substrate 150.

In the example of FIG. 1, one end of the heating elements 110, 112 makes contact with conductive strips 151 and 152, respectively, and the other end of the heating elements 110, 112 makes contact with conductive strip 153 as a "common", which in one embodiment may be coupled to a common ground.

In one embodiment, the conductive strips 151, 152, 153 are coupled to conductive pads 161, 162, 163, respectively, on an opposite side of the package substrate through vias 171, 172, 173, respectively. The conductive pads 161, 162, 163 are coupled to leads or solder bumps for attaching the package substrate to a circuit board. Additionally the conductive pads 161, 162, 163 may assist with heat dissipation from the TOS 105.

Figure 2:
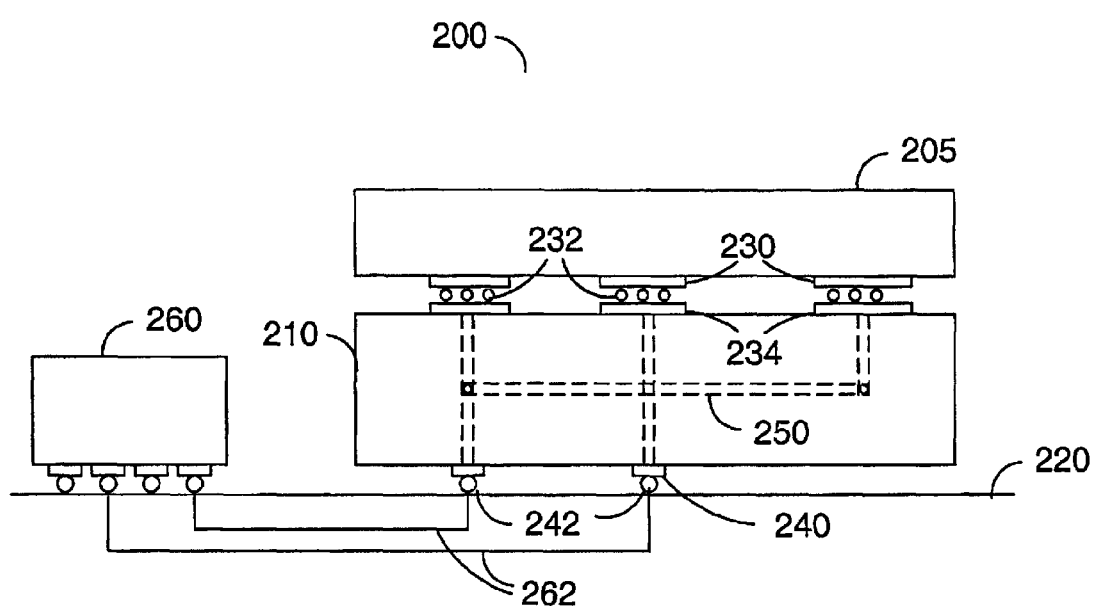
FIG. 2 is a schematic diagram showing an example of a cross-section of an opto-electronic device attached to a circuit board.

FIG. 2 is a schematic diagram showing an example of a cross-section of an opto-electronic device 200 attached to a circuit board 220. An opto-electronic substrate 205 is coupled to a package substrate 210 via solder bump technology comprising conductive pads 230 on the opto-electronic substrate, solder bumps 232, and conductive strips 234 on the package substrate 210.

In one embodiment, the conductive strips 234 of the package substrate 210 are coupled to conductive pads 240 on the opposite surface of the package substrate 210, and the conductive pads 240 are attached to the circuit board 220 via solder bumps 242. Alternatively, the conductive strips 234 of the package substrate may be coupled to leads for attaching the package substrate 210 to a circuit board 220. In one example, the leads may be surface mountable, pin grid array, or any of various other types.

A package substrate 210 having multiple layers allows interconnects 250 within the package substrate 210. This provides more flexibility with designing the layouts of the conductive pads 230 of the opto-electronic substrate 205 and the conductive strips 234 of the package substrate 210. Multiple layers also assists with heat dissipation.

An electrical controller 260 may be coupled to the opto-electronic device 200 to provide control of the electrical inputs to the opto-electronic device 200. In one embodiment the electrical controller 260 and the opto-electronic device 200 are both surface mounted to a circuit board 220, and the electrical coupling between the electrical controller 260 and the opto-electronic device 200 are made through interconnects 262 within the circuit board 220.

Returning to FIG. 1, in an alternate embodiment, an electrical controller 300 may be integrated onto the package substrate 150. The electrical controller die may be coupled to the electrical strips either via traces on the package substrate 150 or through a multilayer interconnects within the package substrate 150.

Thus, an opto-electronic device coupled to a package substrate via solder bumps is disclosed. However, the specific embodiments and methods described herein are merely illustrative. For example, although a TOS with two heating elements was described, any number of heating elements could be used with the disclosed architecture. Numerous modifications in form and detail may be made without departing from the scope of the invention as claimed below. The invention is limited only by the scope of the appended claims.

What is claimed is:

1. A thermo-optic switch comprising:
   a first substrate having a first waveguide;
   a heating element in proximity to the first waveguide; and
   a package substrate solder bonded to the first substrate via the heating element.

2. The thermo-optic switch of claim 1, wherein the package substrate has multilayer electrical interconnections therein.

3. The thermo-optic switch of claim 2, wherein the heating element is electrically coupled through the package substrate to electrical bonding surfaces on an exposed surface of the thermo-optic switch.

4. The thermo-optic switch of claim 3, further comprising an electrical controller integrated onto the package substrate.

5. A 2×2 thermo-optic switch, comprising:
   a first substrate having a first waveguide and a substantially parallel second waveguide separated by a distance;
   a first heating element in proximity to the first waveguide;
   a second heating element in proximity to the second waveguide; and
   a package substrate comprising:
      a first conductive strip solder bonded to said first heating element;
      a second conductive strip solder bonded to said second heating element; and
      a third common conductive strip spanning said distance and solder bonded to both said first beating element and said second heating element.

6. The 2×2 thermo-optic switch as recited in claim 5 further comprising:
   a controller to control electric signals to said first conductive strip and said second conductive strip.

7. A thermo-optic switch comprising:
   a first substrate having a plurality of waveguides;
   a plurality of heating elements in proximity to each of said plurality of waveguides; and
   a package substrate having a plurality of conducting strips each solder bonded to one of said plurality of heating elements and further having a common conducting strip solder bonded to the plurality of heating elements.

8. The thermo-optic switch as recited in claim 7, wherein said thermo-optic switch comprises a 2×2 array.

9. The thermo-optic switch as recited in claim 7, wherein said thermo-optic switch comprises an 8×8 array.

10. The thermo-optic switch as recited in claim 7, further comprising:
   a controller operatively connected to said plurality of conducting strips and to said common conducting strip.

* * * * *

UNITED STATES PATENT AND TRADEMARK OFFICE
CERTIFICATE OF CORRECTION

PATENT NO. : 6,787,919 B2
DATED : September 7, 2004
INVENTOR(S) : Su

Page 1 of 1

It is certified that error appears in the above-identified patent and that said Letters Patent is hereby corrected as shown below:

<u>Column 4,</u>
Line 7, delete "beating" and insert -- heating --.

Signed and Sealed this

Thirteenth Day of September, 2005

JON W. DUDAS
*Director of the United States Patent and Trademark Office*